United States Patent
Zies et al.

(10) Patent No.: US 11,214,155 B2
(45) Date of Patent: Jan. 4, 2022

(54) DEVICE FOR CHARGING AT LEAST ONE BATTERY

(71) Applicant: Dr. Ing. h.c. F. Porsche Aktiengesellschaft, Stuttgart (DE)

(72) Inventors: Camila Zies, Stuttgart (DE); David Köhler, Bietigheim-Bissingen (DE); Raoul Heyne, Goslar (DE); Volker Reber, Michelbach an der Bilz (DE); Bekim Basha, Böblingen (DE); Christoph Roggendorf, Markgröningen (DE); Karsten Hähre, Dudenhofen (DE); Stefan Götz, Forstern (DE); Michael Kiefer, Stuttgart (DE); Steve Zander, Marbach am Neckar (DE); Christian Metzger, Tamm (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 0 days.

(21) Appl. No.: 16/031,106

(22) Filed: Jul. 10, 2018

(65) Prior Publication Data
US 2019/0016225 A1    Jan. 17, 2019

(30) Foreign Application Priority Data
Jul. 12, 2017 (DE) .......................... 102017115631.3

(51) Int. Cl.
*B60L 11/18*    (2006.01)
*H05K 7/20*    (2006.01)
(Continued)

(52) U.S. Cl.
CPC ............... *B60L 53/11* (2019.02); *B60L 53/14* (2019.02); *B60L 53/18* (2019.02); *B60L 53/302* (2019.02);
(Continued)

(58) Field of Classification Search
CPC .. B60L 11/1825; B60L 11/18; B60L 2240/36; B60L 2210/30; B60L 2210/10;
(Continued)

(56) References Cited

U.S. PATENT DOCUMENTS 1,983,204 A * 12/1934 Widmer ................ H02M 7/006
363/116
5,594,315 A    1/1997 Ramos et al.
(Continued)

FOREIGN PATENT DOCUMENTS

DE    112012003099 T5    7/2014
DE    102014212936 A1    1/2016
(Continued)

OTHER PUBLICATIONS

Notification of Reason for Rejection for Japanese Application No. 2018-131984, dated Jun. 18, 2019, 7 pages.
(Continued)

*Primary Examiner* — Richard Isla
*Assistant Examiner* — Dung V Bui
(74) *Attorney, Agent, or Firm* — RatnerPrestia

(57) ABSTRACT

A device for charging at least one battery has an electronics module and at least one charging pillar with a charging point. The electronics module has at least one power electronics unit having an AC/DC converter and a DC/DC converter, wherein the electronics module and the at least one charging pillar are spatially separate from one another.

20 Claims, 8 Drawing Sheets

(51) Int. Cl.
  *B60L 53/10* (2019.01)
  *H02J 7/00* (2006.01)
  *B60L 53/31* (2019.01)
  *H02J 7/02* (2016.01)
  *B60L 53/18* (2019.01)
  *B60L 53/30* (2019.01)
  *B60L 53/302* (2019.01)
  *B60L 53/14* (2019.01)

(52) U.S. Cl.
  CPC .............. *B60L 53/31* (2019.02); *B60L 53/32* (2019.02); *H02J 7/0013* (2013.01); *H02J 7/0027* (2013.01); *H02J 7/02* (2013.01); *H05K 7/20927* (2013.01); *B60L 2210/10* (2013.01); *B60L 2210/30* (2013.01); *B60L 2240/36* (2013.01)

(58) Field of Classification Search
  CPC ........ B60L 53/302; B60L 53/18; B60L 53/32; B60L 53/30; B60L 53/11; B60L 53/31; B60L 53/14; H05K 7/20927; H05K 7/20; H02J 7/0027; H02J 7/0013; H02J 7/02
  USPC ......................................................... 320/109
  See application file for complete search history.

(56) References Cited

U.S. PATENT DOCUMENTS

| | | | |
|---|---|---|---|
| 5,909,099 | A | 6/1999 | Wanatabe et al. |
| 6,396,241 | B1 | 5/2002 | Ramos et al. |
| 8,862,388 | B2* | 10/2014 | Wu .................... B60L 53/80 701/425 |
| 9,233,618 | B2 | 1/2016 | Dyer et al. |
| 9,997,917 | B2* | 6/2018 | Kim .................... H02M 7/48 |
| 10,033,196 | B2* | 7/2018 | Kim .................... H02M 1/36 |
| 10,040,363 | B2* | 8/2018 | Beaston .............. H02J 7/0027 |
| 10,389,116 | B2* | 8/2019 | Tani .................... H02J 3/24 |
| 2002/0140289 | A1* | 10/2002 | McConnell ............ B60R 11/02 307/10.1 |
| 2008/0002364 | A1 | 1/2008 | Campbell et al. |
| 2010/0121511 | A1* | 5/2010 | Onnerud ............. B60L 58/15 701/22 |
| 2011/0133560 | A1 | 6/2011 | Yamashita et al. |
| 2012/0169280 | A1* | 7/2012 | Chi .................... H02J 7/007 320/109 |
| 2012/0188714 | A1* | 7/2012 | Von Borck .......... H01M 10/663 361/688 |
| 2013/0069588 | A1* | 3/2013 | Oda .................... B60L 53/18 320/109 |
| 2013/0069592 | A1* | 3/2013 | Bouman .............. H02J 7/007 320/109 |
| 2013/0093394 | A1 | 4/2013 | Iyasu et al. |
| 2014/0238065 | A1 | 8/2014 | Bonnin et al. |
| 2015/0054460 | A1* | 2/2015 | Epstein .............. B60L 53/64 320/109 |
| 2015/0117062 | A1* | 4/2015 | Jin .................... H02M 1/4241 363/17 |
| 2015/0217654 | A1* | 8/2015 | Woo .................... B60L 53/11 320/109 |
| 2016/0090002 | A1 | 3/2016 | Noack |
| 2016/0149417 | A1* | 5/2016 | Davis .................. H02J 7/045 320/162 |
| 2016/0270257 | A1 | 9/2016 | Mark |
| 2016/0288664 | A1 | 10/2016 | Biagini et al. |
| 2016/0311333 | A1 | 10/2016 | Spesser |
| 2016/0330876 | A1* | 11/2016 | Fujiwara ............ H05K 7/20936 |
| 2016/0355096 | A1 | 12/2016 | Herke |
| 2016/0375781 | A1 | 12/2016 | Herke et al. |
| 2016/0380441 | A1* | 12/2016 | Groat .................. H02J 7/0071 320/107 |
| 2017/0005471 | A1* | 1/2017 | Kim .................... H02J 3/382 |
| 2017/0088005 | A1* | 3/2017 | Christen .............. B60L 11/1874 |
| 2017/0264111 | A1* | 9/2017 | Komatsu .............. H01F 38/30 |
| 2017/0282747 | A1* | 10/2017 | Wang .................. B60L 11/1868 |
| 2018/0233929 | A1* | 8/2018 | Schultz ............... H02J 7/342 |
| 2018/0291859 | A1* | 10/2018 | Namuduri .............. B60L 50/61 |
| 2018/0297477 | A1* | 10/2018 | Stanfield ............. H02J 7/0013 |

FOREIGN PATENT DOCUMENTS

| | | |
|---|---|---|
| DE | 102015110023 A1 | 12/2016 |
| EP | 2665152 A2 | 11/2013 |
| EP | 2572431 B1 | 8/2014 |
| GB | 2536653 A | 9/2018 |
| JP | H10106867 A | 4/1998 |
| JP | 2011125124 A | 6/2011 |
| JP | 2012016239 A | 1/2012 |
| JP | 2012222999 A | 11/2012 |
| JP | 2013529052 A | 7/2013 |
| JP | 2014166003 A | 9/2014 |
| JP | 2014170541 A | 9/2014 |
| JP | 2015033251 A | 2/2015 |
| JP | 2015103712 A | 6/2015 |
| JP | 2016208833 A | 12/2016 |
| WO | 2010114454 A1 | 10/2010 |
| WO | 2011145939 A2 | 11/2011 |
| WO | 2013104408 A1 | 7/2013 |
| WO | 2013159821 A1 | 10/2013 |
| WO | 2014009369 A2 | 1/2014 |

OTHER PUBLICATIONS

Hõimoja et al., "Power Interfaces and Storage Selection for an Ultrafast EV Charging Station", 6th IET International Conference on Power Electron, 2012, 286 pp.
Hering, T., The Key to Successful Electromobility, Jun. 22, 2017, 60 pp.
Rittal: Outdoor Systems Solutions, The Whole is more than the Sum of its Parts, Rittal GmbH & Co. KG, 35745 Herbom, 2014—Company Magazine, 10 pp.
DKE—Technica Guideline—Electromobility Charging Infrastructure, Version 2, Frankfurt, Germany, 2016, Company Magazine, 38 pp.
European Search Report for Application No. 18020058.6, dated Jul. 31, 2018—13 pages.
European Search Report for Application No. 18020058.6, dated Nov. 29, 2018—15 pages.
Setec-Power.com, "Electric Car Solar MPPT Fast Charging Station 50KW", https://www.alibaba.com/product-detail/electric-car-solar-MPPT-fast-charging_60476457940.html—9 pages, Dec. 2015.
"1000-V SiC MOSFET Raises Power Density of EV Battery Chargers", How2Power Today, Your Design Newsletter, Issue: Oct. 2016, 13 pages, http://www.how2power.com/newsletters/1610/products/H2PToday1610_products_Wolfspeed.pdf?NOREDIR=1.
Australian Examination Report for Australian Application No. 2018204412, dated Apr. 5, 2019, 2 pages.
German Search Report for German Application No. 10 2017 115 631.3, dated Mar. 29, 2018, with partial English translation—11 pages.
Heliox: Heliox Fast Charge Systems, Oct. 27. 2016, www.heliox.nl/news/heliox-fast-charge-systems—8 pages.
Jauch, F., "Medium Voltage AC-DC Converter Systems for Ultra-Fast Charging Stations for Electric Vehicles", Doctoral Thesis, ETH Zurich Research Collection, 2016—280 pages.
Japanese Notification of Reason for Rejection for Japanese Application No. 2018-131984, dated Dec. 17, 2019, 6 pages.
Indian Examination Report for Indian Application No. 201814022682, dated Nov. 27, 2019 with translation, 5 pages.

* cited by examiner

DEVICE FOR CHARGING AT LEAST ONE BATTERY

CROSS-REFERENCE TO RELATED APPLICATIONS

This application claims priority to German Patent Application No. DE 10 2017 115 631.3, filed Jul. 12, 2017, which is incorporated by reference herein in its entirety.

FIELD OF THE INVENTION

The invention relates to a device for charging at least one battery, in particular or vehicles with an electric drive.

BACKGROUND OF THE INVENTION

GB 2 536 653A, which is incorporated by reference herein, presents a direct current capacity supply with a rectifier and a multiplicity of direct current output stages for charging batteries with a high charging capacity.

U.S. Pat. No. 5,594,315, which is incorporated by reference herein, presents an induction charging device for charging a battery. The induction charging device has a primary winding which is connected to a voltage source in order, to generate a magnetic flux, and it has cooling lines through which liquid coolant, fed by a pump, flows in order to cool the induction charging device.

U.S. Pat. No. 6,396,241 B1, which is incorporated by reference herein, presents an inductive charging coupling which is supplied with current via a capacity cable. A coolant line runs via the capacity cable to the charging coupling and can therefore cool the charging coupling and the capacity cable.

WO 2010/114454 A1, which is incorporated by reference herein, presents a system for charging a battery which is connected to a capacity grid with a voltage of up to 54 kV.

WO 2014/009369 A2, which is incorporated by reference herein, presents a direct current high-speed charging station of a modular design.

There is a general aim to charge electric vehicles quickly, and this requires high charging capacities which are very demanding in terms of the charging device. A current standard for this is IEC 61851-23, Mode 4, Section CC, which is incorporated by reference herein. High charging capacities are desired.

SUMMARY OF THE INVENTION

Therefore, an object of the invention is to make available a new device for charging batteries.

The object is achieved by means of a device as claimed in claim 1.

The spatial separation of the electronics module and the charging pillar permits a modular design, and the charging pillar can be made slender. In addition, the charging pillar can be embodied in a low-noise fashion, since the cooling of the power electronics does not have to occur directly in the charging pillar.

According to one preferred embodiment the at least one power electronics unit is designed to supply precisely one charging point with a direct voltage. This makes possible a power electronics unit which is not too large and permits expansion with power electronics sub-units according to demand.

According to one preferred embodiment, the at least one power electronics unit has semiconductor switches which are embodied as silicon carbide semiconductor switches. Owing to the good switching properties and the low losses, these semiconductor switches are advantageous in order to permit a small installation space and low capacity loss.

According to one preferred embodiment, the at least one power electronics unit has semiconductor switches which are embodied as gallium-nitride semiconductor switches. Owing to the good switching properties and the low losses, these semiconductor switches are advantageous for permitting a small installation space and low capacity loss. In addition, they do not take up much installation space.

According to one preferred embodiment, the AC/DC converter and the DC/DC converter are embodied without galvanic isolation. This reduces the capacity loss, and measurements have revealed an efficiency level which is higher by approximately 1%.

According to one preferred embodiment, the efficiency level of the power electronics unit is at least temporarily at least 97%. As a result, the necessary cooling capacity for cooling the power electronics unit is reduced. The 97% can be achieved, in particular, at operating points which correspond to the rated operation.

According to one preferred embodiment, the electronics module is arranged in an electronics module housing whose height (H) is less than 1.5 m, preferably less than 1.35 m. This maximum housing height has proven particularly advantageous for transportation.

According to one preferred embodiment, the electronics module has a multiplicity of power electronics sub-unit receptacles which are each designed for the arrangement of a power electronics sub-unit. The power electronics module can also be used if a capacity electronic sub-unit is arranged in only one capacity-electronics sub-unit receptacle, or only one power electronics sub-unit is available, or if there is no capacity electronic sub-unit arranged in some of the capacity electronic sub-unit receptacles. This embodiment has proven advantageous for a modular design, since a different number of power electronics sub-units can be used for a power electronics unit as a function of the maximum charging capacity, and at the same time it is not necessary to provide any unused power electronics sub-units.

According to one preferred embodiment, the power electronics sub-units are embodied as sliding drawers.

According to one preferred embodiment, the electronics module has an electronics module housing which has, on one side, an electronics module housing access via which the receptacles for the power electronics sub-units are accessible, in order to permit maintenance. The maintenance can therefore be carried out from one side, without the entire housing having to be removed.

According to one preferred embodiment, the cooling module has a cooling module housing which cooling module housing has a cooling module housing access on one side in order to permit maintenance.

According to one preferred embodiment, the transformer module has a transformer module housing which transformer module housing has a transformer module housing access on one side, in order to permit maintenance.

According to one preferred embodiment, the at least one power electronics unit is designed to permit a charging point to be supplied with a maximum charging capacity which is at least 60 kW, preferably at least 300 kW, particularly preferably at least 420 kW. The configuration of the device and of the power electronics units is for high charging capacities, and for this purpose it was possible to obtain a modular design and optionally also a slim configuration of the housings.

According to one preferred embodiment, the device has a transformer module with a transformer. The transformer module can be used for a plurality of electronics units. According to one preferred embodiment, the transformer module is spatially separate from the electronics module. This configuration has proven advantageous for the modular design, since the transformer module can be configured in the same way irrespective of the number of electronics modules.

According to one preferred embodiment, the transformer has a primary winding and a plurality of three-phase secondary winding systems, galvanically separate from one another, in a star or triangle configuration, which are respectively assigned to precisely one power electronics unit. As a result, galvanic isolation between the power electronics units which are connected to different secondary winding systems can be achieved with a low capacity loss.

According to one preferred embodiment the entire system which comprises the transformer has a high simultaneity factor which is higher than 0.85, preferably higher than 0.9 and is particularly preferably 1.0. Such a transformer makes possible a very efficient device and therefore a small installation space of the individual modules.

According to one preferred embodiment, the transformer module has a transformer module housing, and the electronics module has an electronics module housing, wherein the transformer module housing and the electronics module housing have the same shape and the same dimensions. This facilitates the logistics when transporting the modules.

According to one preferred embodiment, the device has a cooling module which cooling module is designed to convey a liquid coolant in a coolant circuit. The modular design can be cooled particularly well by means of a liquid coolant, since liquids have a high thermal capacity.

According to one preferred embodiment, the cooling module and the electronics module are spatially separate from one another. This facilities the positioning and the transportation of the modules.

According to one preferred embodiment, the cooling module is fluidically connected to the electronics nodule, in order to permit the electronics module to be cooled. This reduces the distances to be covered by the cooling lines and facilities the isolation of the coolant flow by means of the individual branches of the cooling circuit.

According to one preferred embodiment, the electronics module is fluidically connected to at least one charging pillar, in order to permit a flow of coolant from the electronics module to the charging pillar and preferably also from the charging pillar back to the electronics module. This also reduces the distances to be covered by the cooling lines and facilities the fluidic connection.

According to one preferred embodiment, the at least one charging pillar has a charging cable and a heat exchanger, and the cooling module is fluidically connected to the heat exchanger of the at least one charging pillar, in order to permit the charging cable to be cooled using the heat exchanger. As a result, advantageous cooling in the region of the charging pillar is made possible in the entire system.

According to one preferred embodiment, the cooling module is fluidically connected to a power electronics unit and a charging pillar which is assigned to this power electronics unit, in such a way that a coolant circuit from the cooling module via the charging pillar and via the power electronics unit assigned to the charging pillar and back to the cooling module, is made possible.

According to one preferred embodiment, the cooling module is fluidically connected to the power electronics unit and a charging pillar assigned to this power electronics unit in such way that a coolant circuit from the cooling module via the charging pillar and via the power electronics assigned to the charging pillar and back to the cooling module is made possible. This results in a functional unit, and when the cooling module is functioning the power electronics unit and the associated charging pillar are cooled and can therefore be used. The coolant circuit can also be embodied in the reverse sequence.

According to one preferred embodiment, the cooling module has at last two cooling units which are each assigned to a separate coolant circuit. If one of these cooling units fails, some of the charging pillars can still be used by means of the cooling by the other cooling unit. In addition, a cooling unit housing with the preferred dimensions can receive at least two cooling units, preferably precisely two cooling units.

According to one preferred embodiment, the at least two cooling units are fluidically connected to different charging pillars and power electronics units, in order to permit at least some of the power electronics units and charging pillars to be cooled when one of the at least two cooling units fails.

According to one preferred embodiment, each of the at least two cooling units is designed for at maximum three power electronics units and charging points. This number has proven particularly suitable for the modular design.

According to one preferred embodiment, the cooling module is arranged in a cooling module housing whose height is less than 1.5 m, preferably less than 1.35 m. This is very advantageously suitable for transportation and storing logistics.

According to one preferred embodiment, the cooling module has a cooling module housing, and the electronics module has an electronics module housing, wherein the cooling module housing and the electronics module housing have the same shape and the same dimensions. This facilities the logistics when transporting the modules.

According to one preferred embodiment, the cooling module is fluidically connected to at least two power electronics units, connected in parallel, to form a coolant circuit, wherein controllable through-flow control means are provided in order to be able to influence in relation to one another the cooling capacity for the at least two power electronics units which are connected in parallel. As a result, the maximum necessary cooling capacity can be set lower, since all the charging points are not continuously occupied or charged with the full charging capacity. The cooling capacity which is present can be used better with the through-flow control means.

BRIEF DESCRIPTION OF THE DRAWINGS

Further details and advantageous developments of the invention can be found in the exemplary embodiments which are described below, illustrated in the drawings and are not to be understood in any way as a limitation, as well as from the sub-claims. In the drawings:

DETAILED DESCRIPTION OF THE INVENTION

The device or charging station can be provided at a car park with a charging facility, but it is also possible to configure an electric charging station which is located, for example, on a freeway like a freeway gas station.

Figure 1:
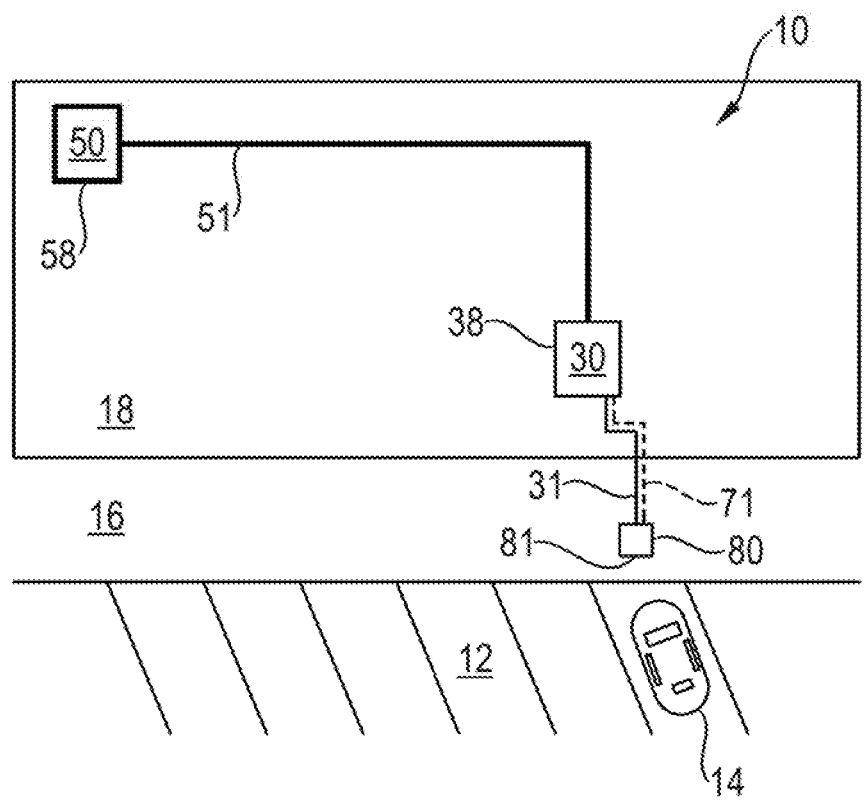
FIG. 1 shows a schematic plan view of a charging station with a charging pillar.

FIG. 1 shows a device 10 for charging battery of a vehicle 14, in particular for charging a traction battery. Parking spaces 12 are shown schematically on which a vehicle 14 or a plurality of vehicles 14 can be parked. For example, a side walk 16 is provided and an area 18, for example a gravel area or a garden area, is provided on the side of the side walk 16 facing away from the parking spaces 12.

The device 10 has a transformer module 50 which is connected to an electronics module 30 via an electrical line 51. The electronics module 30 is connected to a charging pillar 80 via an electrical line 31 and via a coolant line 71. The coolant line 71 is illustrated with dashed lines. The charging pillar 80 has a charging point 81. The electronics module 30 and the charging pillar 80 are spatially separate from one another, and this is advantageous since the charging pillar 80 can be made slim, that is to say requires a particularly small amount of insulation space, by virtue of the separation from the electronics module 30. In addition, the electronics module 30 requires cooling at high charging capabilities, which can give rise to noise. The separate installation of the electronics module 30 therefore permits a charging pillar 80 which generates only low interference noise, or none at all.

The electronics module 30 has an electronics module housing 38, and the transformer module has a transformer module housing 58. The transformer module housing 58 and the electronics module housing 38 preferably have the same shape and the same dimensions, as is indicated by the same size of the schematically illustrated modules. The transformer module housing 58 and the electronics module housing 38 are preferably embodied as cuboids, but it is, for example, also possible to select a pillar-shaped design or a design with a hexagonal cross section.

The electronics module 30 is additionally designed for cooling in the exemplary embodiment, wherein both cooling of the electronics module 30 and cooling of the charging pillar 80 via the coolant line 71 is possible.

Figure 2:
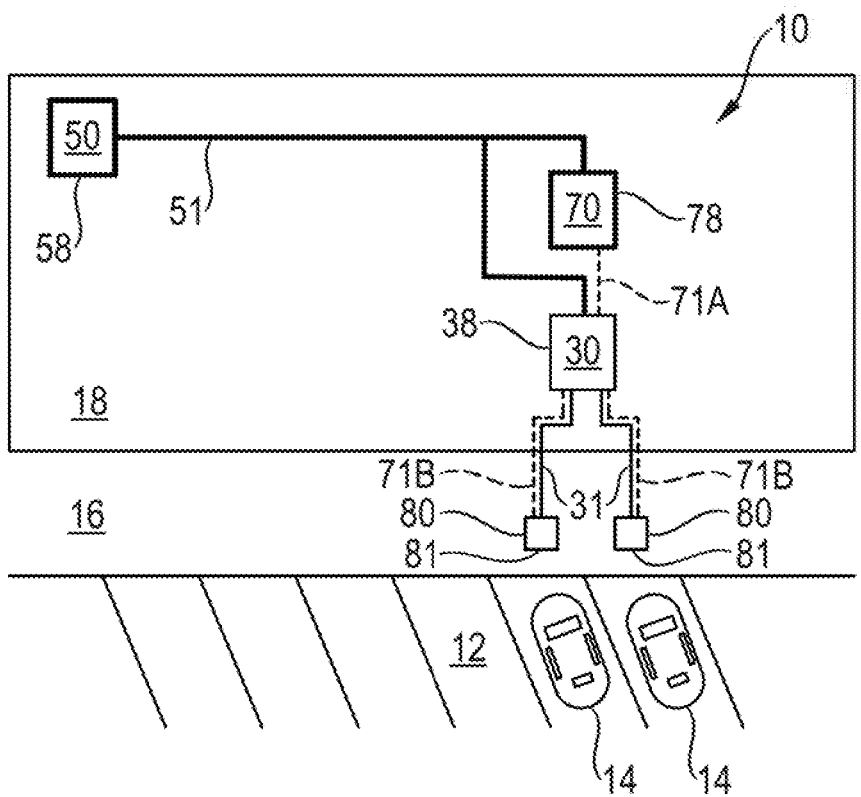
FIG. 2 shows a schematic plan view of a charging station with two charging pillars.

FIG. 2 shows an exemplary embodiment of the device 10 with two charging pillars 80. In contrast to FIG. 1, a separate cooling module 70 is provided. The transformer module 50 supplies electrical energy both to the cooling module 70 and to the electronics module 30 via a line 51. The electronics module 30 supplies both charging pillars 80 with current via electrical lines 31. The cooling module 70 is connected to the electronics module 30 via a coolant line 71A, in order to permit a flow of coolant to the electronics module 30 or a flow of coolant from the electronics module 30 and preferably a flow coolant in both directions. The electronics module 30 is connected to the charging pillars 80 via coolant lines 71B, and therefore permits the coolant to be fed to the charging pillars 80 or from the charging pillars 80. The coolant lines 71B also preferably permit a return flow of the coolant from the charging pillars 80 to the electronics module 30, or vice versa.

The electronics module 30 is also arranged separately from the charging pillars 80 here.

The cooling module 70 has a cooling module housing 78, and the shape and the dimensions of the cooling module housing 78 preferably correspond to the shape and the dimensions of the transformer module housing 58, and preferably also of the electronics module housing 38.

The same design of the housings considerably facilitates the transportation of the modules since the housings can be combined as desired, for example, in a truck.

Figure 3:
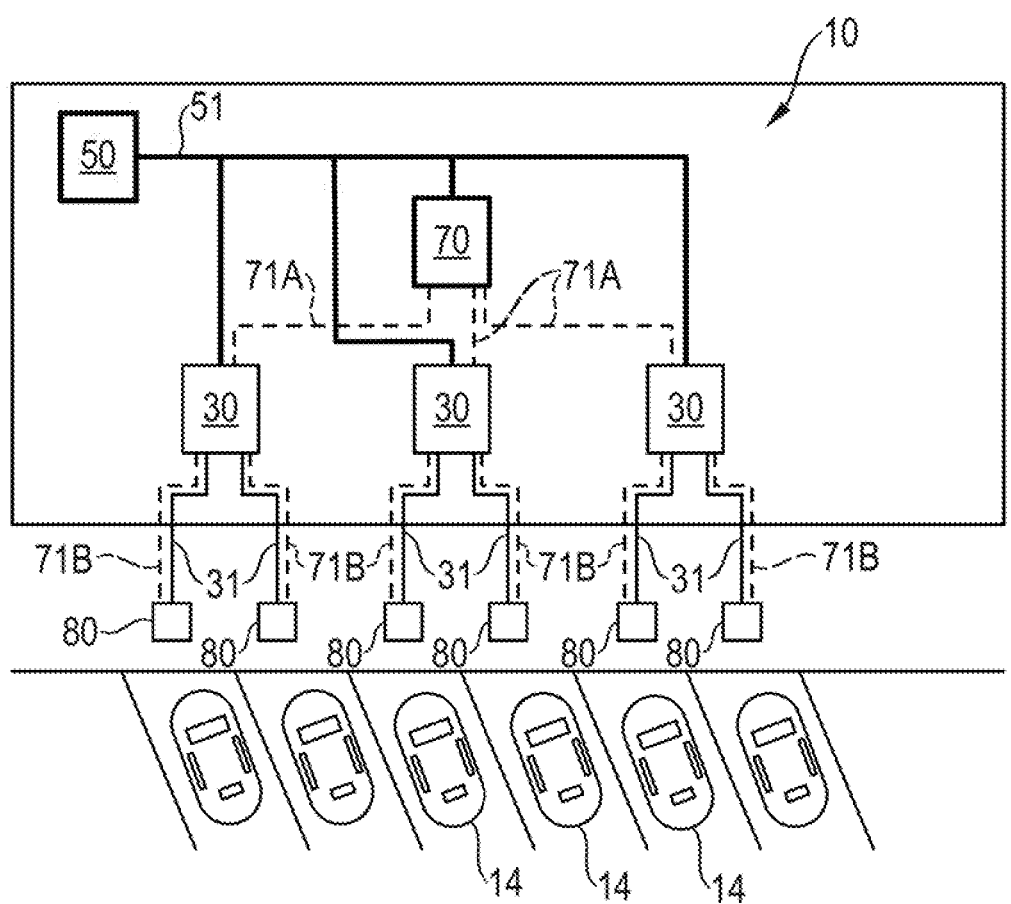
FIG. 3 shows a schematic plan view of a charging station with six charging pillars.

FIG. 3 shows the device 10 in a high expansion stage. Six pillars 80 are provided, wherein in each case two charging pillars 80 are supplied by the electronics module 30 via electrical lines 31. The transformer module 50 is connected via electrical lines 51 to the cooling module 70 and to the electronics modules 30, in order to supply them with electrical energy. The cooling module 70 is connected to the electronics modules 30 via lines 71A, in order to feed coolant to them. The cooling module 70 is therefore used as a central cooling module 70 for a multiplicity of electronics module 70. The electronics modules 30 are connected to the charging pillars 80 via coolant lines 71B, in order to permit a flow of coolant between the electronics modules 30 and the charging pillars 80.

As is apparent from FIG. 1 to FIG. 3, a modular design of the device 10 in different expansion stages can be achieved with the electronics modules 30 and the cooling module 70. The embodiment in FIG. 3 with the cooling module 70, the electronics modules 30 and the charging pillars 80 can be doubled, in order to permit a device with twelve charging pillars, and correspondingly any other number of one to twelve charging pillars 80 or charging points 81 can also be correspondingly implemented in a modular fashion.

A central charging park controller or controller of the device 10 is preferably provided, and can be arranged, for example, in the transformer module 50.

Figure 4:
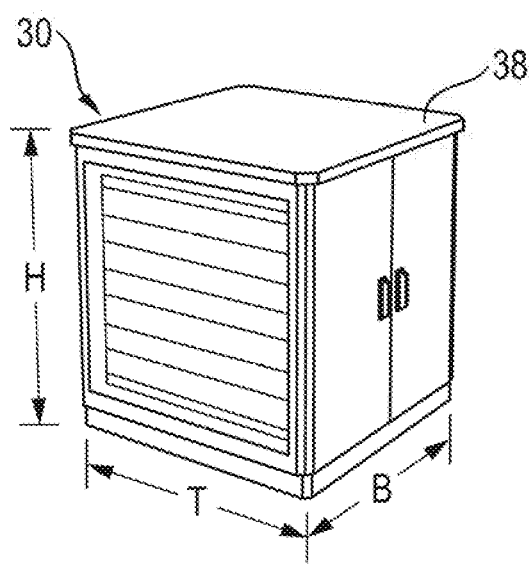
FIG. 4 shows a three-dimensional illustration of an electronics module with a power electronics unit and integrated cooling unit.

FIG. 4 shows an embodiment of the electronics module 30 with an electronics module housing 38. The electronics module 38 is of cuboid design, and the width B, the depth T and the height H are shown.

The height H is preferably less than 1.5 m, more preferably less than 1.35 m. This height restriction has proven advantageous for the transportation of the electronics module housing 38. In addition, in many regions the need for building permission does not apply to such a height. Such a housing with a manageable size is also advantageously used. The width B is preferably in the range of 1.0 to 1.4 m, more preferably in the range 1.1 m to 1.3 m and is particularly preferably 1.2 m. The depth T is preferably in the range from 0.4 m to 0.8 m, more preferably in the range from 0.5 m to 0.7 m, and it is particularly preferably 0.6 m. These dimensions are advantageous in particular for transportation with a truck. The loading surface of a truck can frequently have a width of 2.44 m and a height of 2.26 m.

Figure 5:
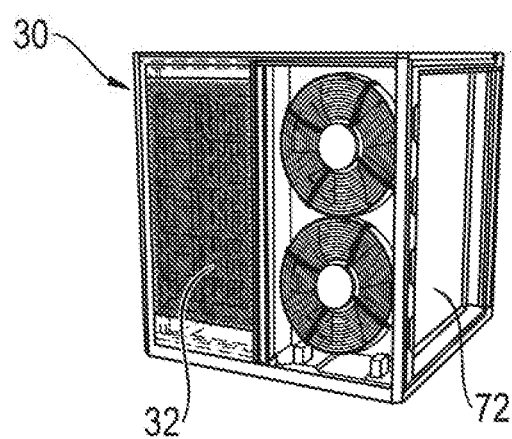
FIG. 5 shows a three-dimensional illustration of the electronics module in FIG. 4 without side walls.

FIG. 5 shows the electronics module 30 from FIG. 4 without an outer wall. A power electronics unit 32 and a cooling unit 72 are provided in the electronics module 30. The cooling unit 72 cools, for example, using two blowers.

Figure 6:
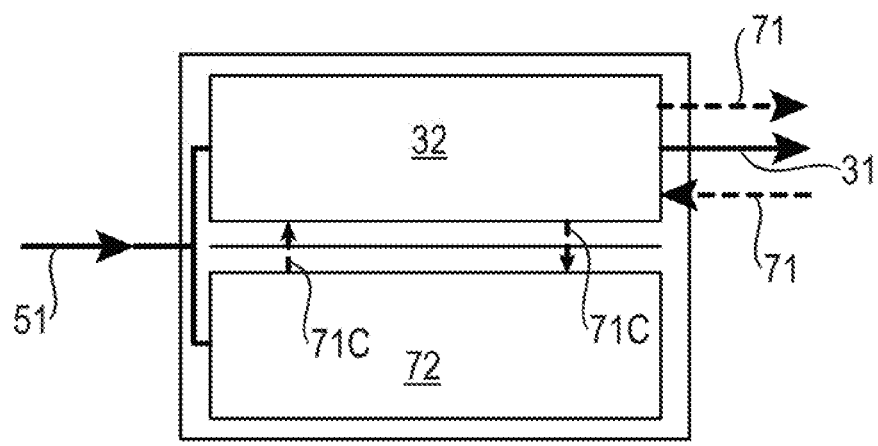
FIG. 6 shows a schematic illustration of the electronics module in FIG. 4.

FIG. 6 shows a schematic illustration of the design of the electronics module 30. A power electronics unit 32 and a cooling unit 72 are provided in the electronics unit 30. Both units are supplied with electrical energy via an electrical line 51. The cooling unit 72 is connected to the power electronics unit 32 via coolant lines 71C, and thereby permits cooling of the power electronics unit 32. The power electronics unit 32 has an electrical line 31 for supplying capacity to a charging pillar 80. In addition, coolant lines 71 extend from the power electronics unit 32 in the direction of the charging pillar 80, in order to permit a flow of coolant to the charging pillar 80 and back therefrom. The connections for the electrical lines 51, 31 and the coolant lines 71 are preferably all arranged on one side of the housing and are accessible there, preferably on the front side behind the housing access.

The power electronics unit 32 is preferably designed to supply precisely one charging point 81 with a direct voltage. In this context, there is the possibility of optionally supplying a first charging point 81 or a second charging point 81 via the power electronics unit 32, but not both at the same time. This can be advantageous e.g. if two charging points which can be selected as a function of the parking position are provided at a parking space. This alternative double use can provide a saving in costs for the power electronics unit.

Precisely one charging point 81 is preferably provided at a charging pillar 80.

The provision of a power electronics unit 32 and of a cooling unit 72 in an electronics module 30 is advantageous given a small design of the device 10 as shown in FIG. 1, since the electronics module housing 38 is utilized well in spatial terms.

Figure 7:
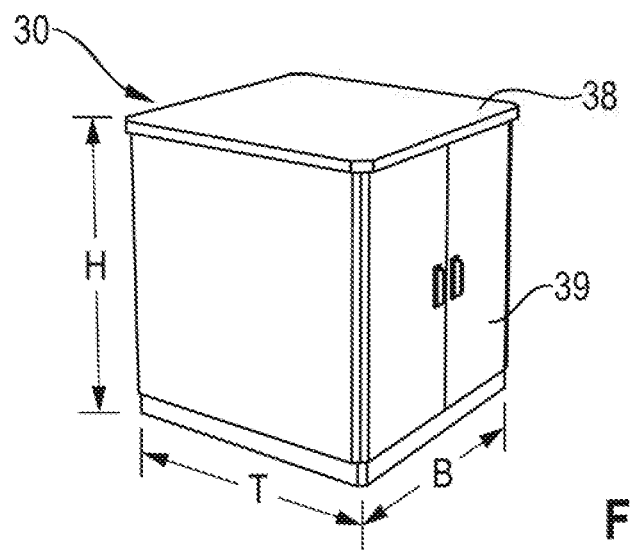
FIG. 7 shows a three-dimensional illustration of an electronics module with two power electronics units.

FIG. 7 shows a further embodiment of the electronics module 30 with the electronics module housing 38. The statements made with regard to FIG. 4 apply to the shape and the dimensions of the electronics module housing 38. The electronics module 38 has an electronics module housing access 39 on one side of the electronics module housing 38. Via this electronics module housing access 39 it is preferably possible to mount or remove power electronics units 32, and maintenance can be carried out.

Figure 8:
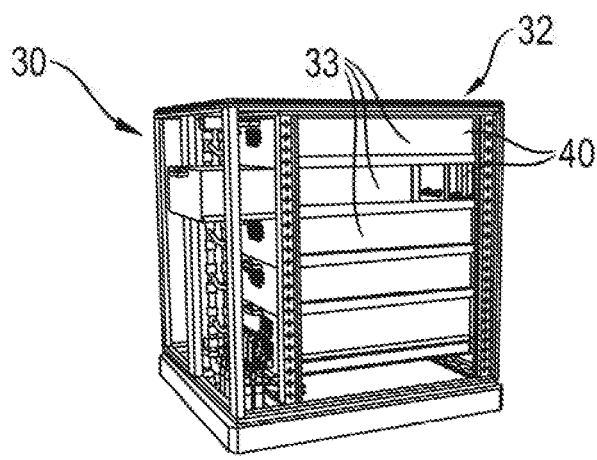
FIG. 8 shows a three-dimensional illustration of the power electronics module in FIG. 7 without side walls.

FIG. 8 shows the electronics module 30 from FIG. 7, but without outer walls. One of the electronics modules 32 is illustrated for both. The electronics module 32 has a multiplicity of receptacles 40, and for example power electronics sub-units 33 can be inserted into these receptacles 40. Each of the power electronics sub-units 33 permits, for example, a maximum charging capacity of 60 kW. The charging capacities of the power electronics sub-units are added together, with the result that the power electronics unit 32 with a power electronics sub-unit 33 has a maximum charging capacity of 60 kW, and a maximum charging capacity of 360 kW with six capacity electronic sub-units 33. In the exemplary embodiment, a maximum of seven power electronics sub-units 33 can be used for each power electronics unit 32. As a result, power electronics sub-units 33 can be used according to demand. This permits a modular design to the effect that power electronics sub-units 33 have to be used only when they are required for a corresponding charging pillar 80. The respective power electronics unit 32 can preferably be used even when power electronics sub-units 33 are arranged in only some of the power electronics sub-unit receptacles 40. The power electronics sub-units 33 can be embodied, for example as sliding drawers, in particular as 19 inch sliding drawers.

Figure 9:
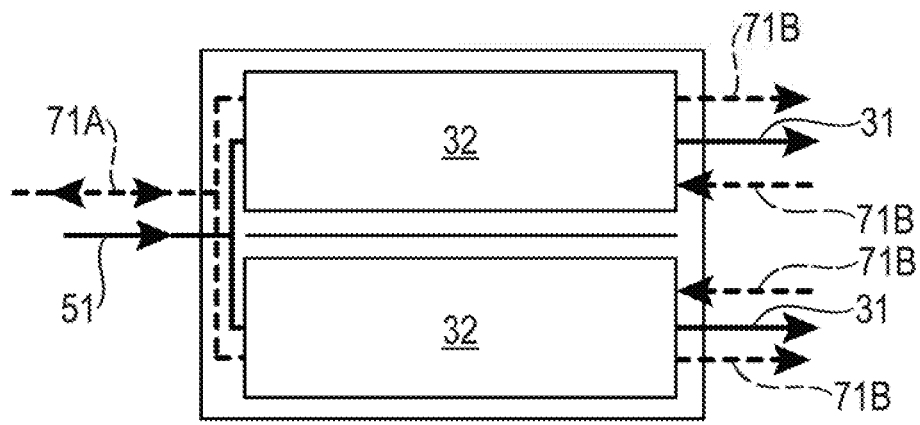
FIG. 9 shows a schematic illustration of the electronics module in FIG. 7.

FIG. 9 shows a schematic illustration of the electronics module 30 in FIG. 7. The power electronics units 32 are supplied with capacity via an electrical line 51, and each power electronics unit supplies a charging pillar 80 with electrical energy via an electrical line 31. Coolant lines 71A are connected to the power electronics units 32, in order to permit a flow of coolant with interaction with a cooling module 70.

The coolant is used to cool the power electronics units 32, and said coolant is fed from the respective power electronics unit 32 to a charging pillar 18 via coolant lines 71B.

The connections for the electrical lines 51, 31 and the coolant lines 71A, 71B are preferably all arranged on a side of the housing and accessible here, preferably on the front side behind the housing access.

Figure 10:
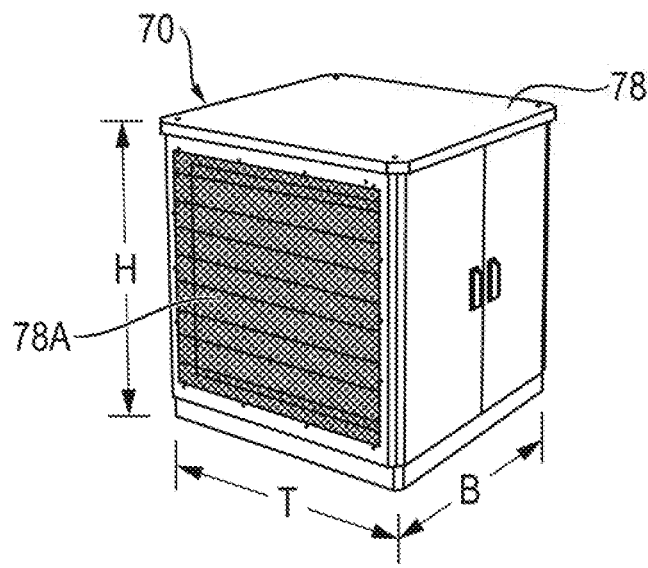
FIG. 10 shows a three-dimensional illustration of a cooling module with two cooling units.

FIG. 10 shows a cooling module 70 with a cooling module housing 78. The shape and the dimensions of the cooling module housing 78 preferably correspond to the shape and the dimensions of the electronics module housing 38 in FIG. 4. A side wall 78A is preferably provided with a grill in order to permit good cooling.

Figure 11:
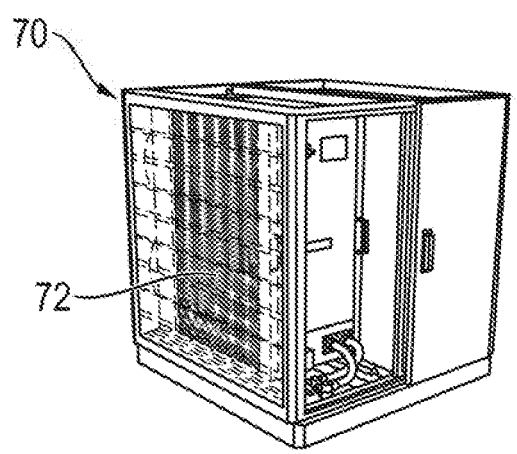
FIG. 11 shows a three-dimensional illustration of the cooling module in FIG. 10 without side walls.

FIG. 11 shows the cooling module 70 from FIG. 10 with partially removed sidewalk. A cooling unit 72 can be seen which is seen as approximately half of the installation space.

Figure 12:
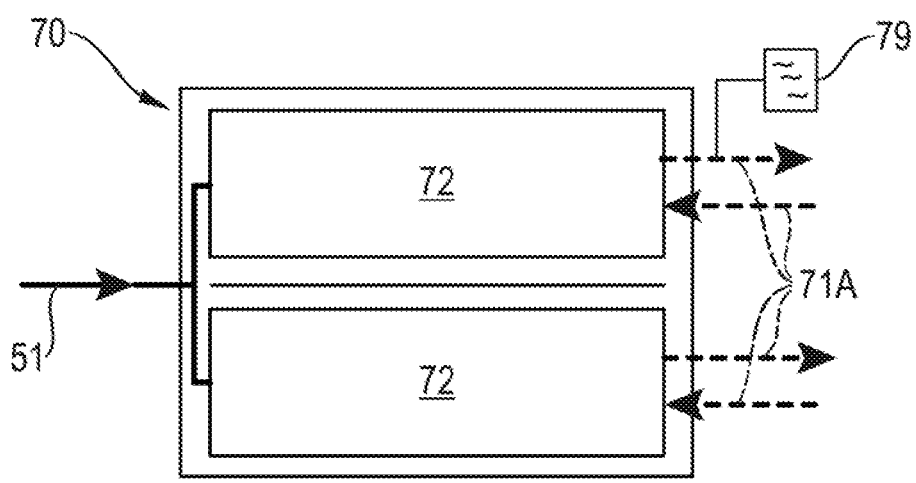
FIG. 12 shows a schematic illustration of the cooling module in FIG. 10.

FIG. 12 shows a schematic illustration of the design of the cooling module 70. The cooling module 70 has at least one cooling unit 72, in the exemplary embodiment that has two cooling units 72 which are supplied with electrical energy via an electrical line 51. Each cooling unit 72 has coolant lines 71A via which the coolant 79 can be fed to an electronics module 30 and also can pass back from it to the cooling unit 72. A coolant circuit can be implemented per cooling unit 72 via the coolant lines 71A.

The connections for the electrical line 51 and the coolant lines 71A are preferably all arranged on one side of the housing and accessible there, preferably on the front side behind the housing access.

Figure 13:
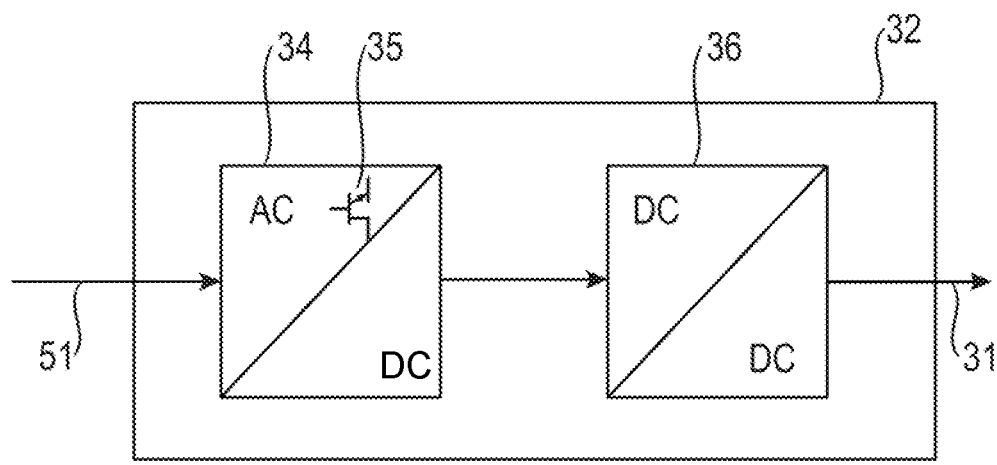
FIG. 13 shows a schematic illustration of a power electronics unit.

FIG. 13 shows a schematic illustration of the design of a power electronics unit 32. The power electronics unit 32 has an AC/DC converter 34, which is also referred to as a rectifier, and a DC/DC converter 36, which is also referred to as a direct voltage converter. An alternating current is fed from the transformer module 50 (see FIG. 2 and FIG. 3) to the power electronics module 32 via an electrical line 51, and said alternating current is rectified in the AC/DC converter 34. Preferably an active rectifier is used as the AC/DC converter 34, said rectifier also permitting the input voltage to be increased. In addition, an active AC/DC converter 34 permits a higher efficiency level, smaller harmonics and a better capacity factor compared to a passive AC/DC converter 34.

The rectified voltage is fed via a direct current intermediate circuit to the DC/DC converter, and the latter permits the amplitude of the direct voltage to be changed. In a normal case, the DC/DC converter 36 reduces the amplitude, but an increase can also be implemented. When an active AC/DC converter 34 is used, a DC/DC converter 36 which can only reduce the amplitude is preferably used. A semiconductor switch 35 such as can be used for the AC/DC converter 34 and/or the DC/DC converter 36 is shown schematically. A silicon-carbide semiconductor switch is preferably used as the semiconductor switch 35. Such semiconductor switches have the advantage that they can be switched very quickly and have comparatively low switching losses. As a result, less capacity loss arises and this permits a particularly compact design of the power electronics units 32.

As an alternative to silicon-carbide semiconductor switches 35, gallium-nitride semiconductor switches 35 can also be used. Gallium-nitride semiconductor switches permit even smaller designs. High-quality IGBT semiconductors can be used, in particular, for relatively low capacities.

The AC/DC converter 34 and the DC/DC converter 36 are preferably embodied without galvanic isolation, that is to say there is no galvanic isolation provided between the electrical line 51 and the electrical line 31. Galvanic isolation is basically associated with capacity losses and therefore such a design permits a relatively small size and requires less cooling. The galvanic isolation can, as described, be achieved by means of the transformer. Galvanic isolation is prescribed in some countries.

The power electronics unit 32 is preferably designed to permit a charging point to be supplied with a maximum charging capacity which at least 60 kW, preferably at least 300 kW and particularly preferably at least 420 kW. A capacity of at least 60 kW, at least 300 kW or at least 420 kW can therefore be achieved when the battery can be charged with a very high charging capacity. This requires a high-capacity power electronics unit 32 and the provision of two such power electronics units 32 in an electronics module 30 has proven very advantageous, since the dimension of the electronics module 30 is still practical for transportation of the electronics module 30. Heavy-duty transportation is not necessarily required.

Figure 14:
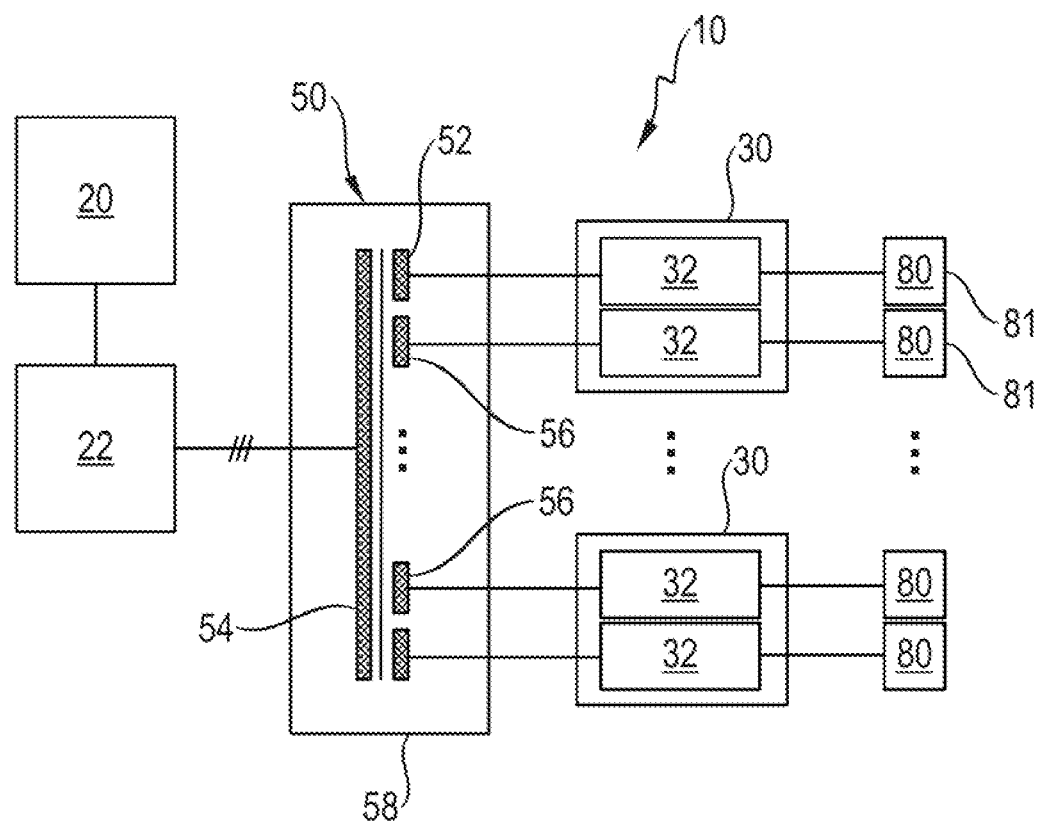
FIG. 14 shows a schematic illustration of an electric circuit diagram of the charging station.

FIG. 14 shows a schematic illustration of an exemplary connection of the device 10 in electrical terms. The capacity grid 20 is connected to a switching system 22, and the switching system 22 is electrically connected to the transformer module 50. The transformer module 50 has a transformer 52 with a primary winding 54 and a multiplicity of secondary winding systems 56. Each secondary winding system 56 is assigned to a power electronics unit 32 and a charging point 81. The embodiment of the transformer 52 with a multiplicity of secondary winding systems which are galvanically isolated from one another permits galvanic isolation in the region of the transformer 52 and therefore the omission of galvanic isolation in the region of the power electronics units 32. In addition, each power electronics unit 32 can pick up the capacity according to demand via the secondary winding system assigned to it, without additional circuitry. This has a positive effect on the simultaneity factor.

The capacity grid 20 has an input voltage which can be, for example, up to 36 kV.

The output voltage which is supplied by the power electronics units can be, for example, up to 950 V, and the output current can be up to 500 A.

It is preferred to use a transformer 52 which permits for the entire system a simultaneity factor which is higher than 0.85, preferably higher than 0.9 and is particularly preferably 1.0. Although such transformers 52 are expensive compared to standard transformers they permit a smaller embodiment of the modules than a transformer which, for example, only permits a simultaneity factor of 0.6 for the entire system. It is also advantageous for a high simultaneity factor that the power electronics units 32 are each used for a charging point, and a plurality of power electronics units 32 are not connected together from one charging point.

In one preferred embodiment, a dry cast resin transformer is used which can be operated above the rated operating level for several hours without damage. The capacity balance between the charging points is preferably provided via the capacity grid and not by connecting together with power electronics units.

When galvanic isolation is provided in the power electronics units, it would be possible to connect together with capacity grids behind the transformer, but the simultaneity factor would drop.

Figure 15:
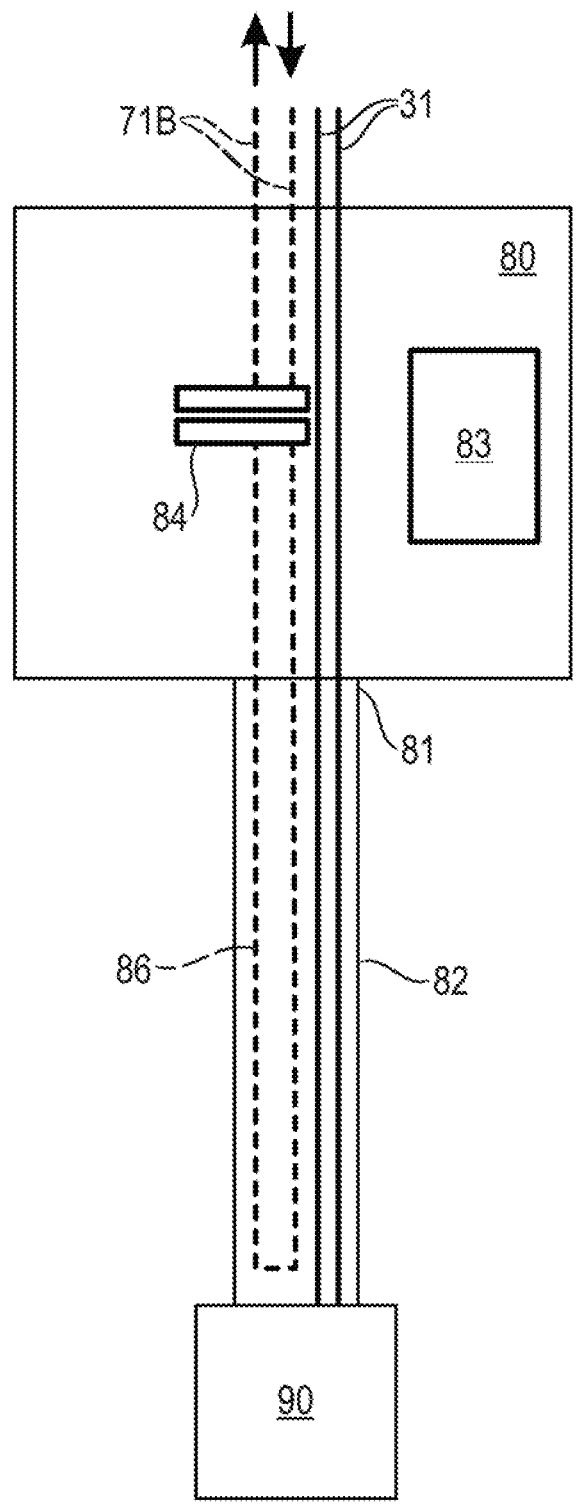
FIG. 15 shows a schematic illustration of a charging pillar.

FIG. 15 shows a schematic illustration of the design of a charging pillar 80. The charging pillar 80 has a heat exchanger 84 which is connected, on the one hand, to the coolant line 71B and, on the other hand, to a coolant circuit 86. A charging cable 86 is illustrated schematically and runs to the charging socket of a battery 90 of a vehicle 14. The electrical line 31 extends either directly into the charging cable 82, or further switches or distributors are provided in the charging column 80. The cooling circuit 86 permits the electrical conductor 31 and the contacts in the charge plug to be cooled, therefore allowing high charging currents. The cooling circuit 86 preferably runs into the charging plug of the charging cable 82. A charging pillar control unit 83, via which the charging process is controlled and operator control is possible, is provided in the charging pillar 80.

Figure 16:
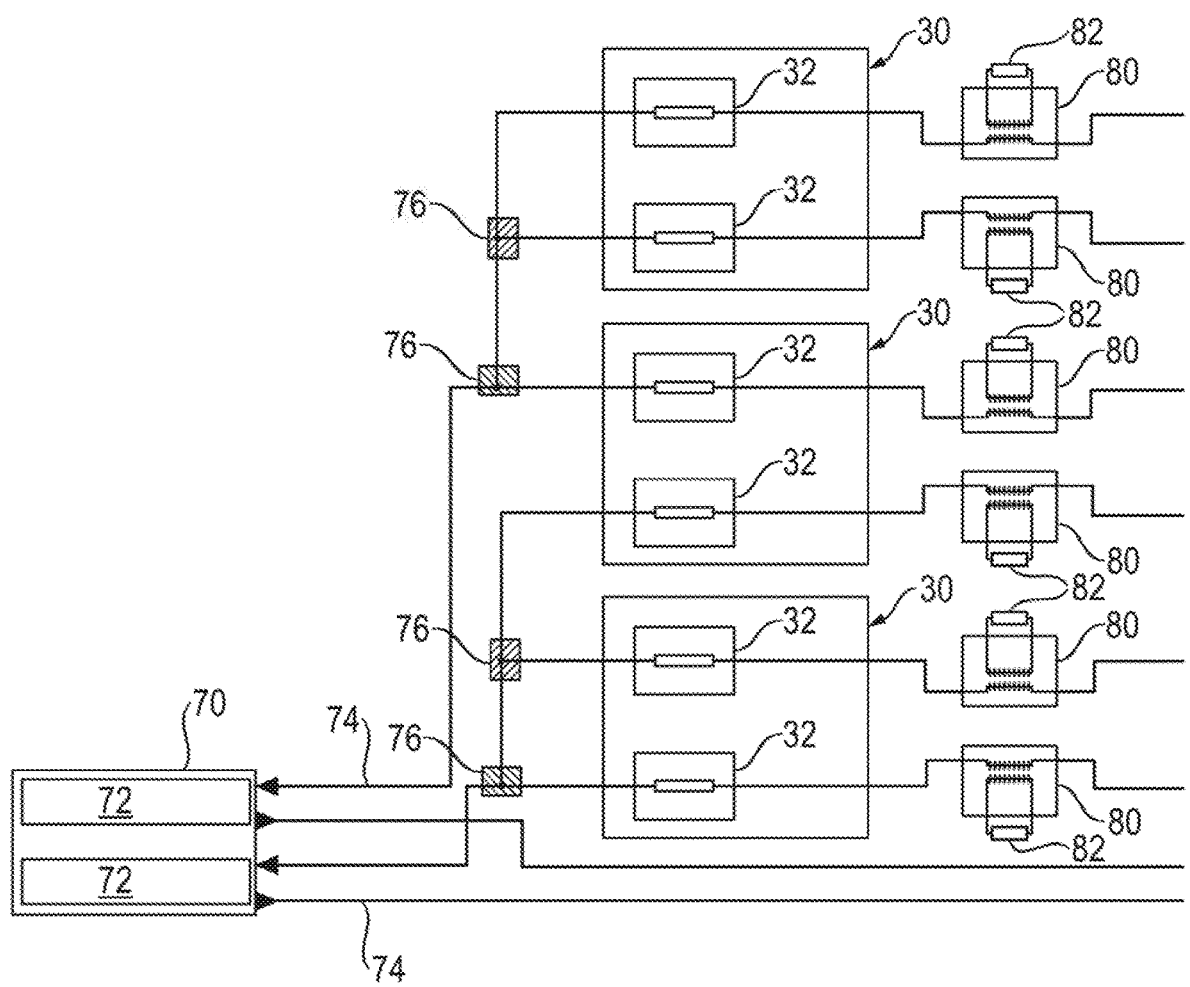
FIG. 16 shows a schematic illustration of the fluidic circuit diagram for the cooling of the charging station.

FIG. 16 shows the fluidic connection of a cooling module 70 to two cooling units 72. Each cooling unit 72 supplies an assigned cooling circuit 74, which respectively comprises three power electronics units 32 connected in parallel. The coolant flows in each case in a branch through a power electronics unit 32 and through a charging pillar 80, which are connected in series with one another. Both directions are possible here.

Controllable through-flow control means 76 are preferably provided in order to be able to influence in relation to one another the cooling capacity for the at least two power electronics units 32 which are connected in parallel. The through-flow control means 76 are, for example, valves such as three-way valves or four-way valves, or flow valves which can change the flow cross section can be provided in the respective branch. The through-flow control means 76 can be provided with a power electronics unit 32 and a charging pillar 80 upstream of the individual branches, or downstream of such a branch or both upstream and downstream of such a branch.

By using the through-flow control means 76 it is possible to set the cooling capacity for the individual branches, and if a large cooling capacity is used in a branch, the cooling capacity in this branch can be correspondingly increased.

The provision of at least two cooling units 72 and the use of the respective coolant circuit 74 for different power electronics units 32 has the advantage that some of the charging pillars 80 can continue to be operated even if one of the cooling units 72 fails.

Of course, a variety of refinements and modifications are possible within the scope of the invention.

If the term electrical line is used in the application, it can have one conductor or else a plurality of conductors. For a direct current, for example, two conductors or three conductors (with a ground connection) can be used, and for an alternating current two, three of four (with a ground connection) conductors can be used. Likewise, in the case of a coolant line it is possible to provide, for example, one pipe or hose, or a plurality of pipes and/or hoses can also be provided, for example for a forward flow and a return flow.

The cooling of the power electronics units 32 and of the charging pillar 80 can take place either directly via a bypass line of the coolant or additional heat exchangers and additional cooling circuits can be provided, such as is shown, for example, for the charging pillar 80 in FIG. 15.

Return valves can be provided in the individual branches of the cooling circuit in order to permit a flow of coolant only in one direction.

What is claimed is:

1. A device for charging a traction battery for a vehicle, the device comprising:
   an electronics module having a plurality of high-capacity power electronics units enabling a charging point to be supplied with a maximum charging capacity above at least 60 kW, the plurality of high-capacity power electronics units having an AC/DC converter and a DC/DC converter that gives rise to interference noise in the electronics module caused during cooling by a cooling module;
   wherein the cooling module is configured to convey a coolant in a coolant circuit and is fluidically connected to the electronics module in order to permit the electronics module to be cooled and thereby cause the interference noise;
   a transformer module including a transformer, wherein the transformer includes a primary winding and a plurality of secondary winding systems which are galvanically separate from one another and which are each assigned to precisely one high-capacity power electronics unit of the plurality of high-capacity power electronics units, wherein the secondary winding systems are embodied as three-phase secondary winding systems in a star or triangle configuration; and
   at least one charging pillar with the charging point, the at least one charging pillar spatially separate from the electronics module to eliminate or reduce interference noise in the at least one charging pillar during cooling of the electronics module by the cooling module;
   wherein:
      the electronics module is fluidically connected to the at least one charging pillar in order to permit at least one of flow of the coolant from the electronics module to the at least one charging pillar, flow of the coolant from the at least one charging pillar to the electronics module, or flow of the coolant in both directions,
      the at least one charging pillar has a charging cable and a heat exchanger, and
      the cooling module is fluidically connected to the heat exchanger of the at least one charging pillar in order to permit the charging cable to be cooled using the heat exchanger.

2. The device as claimed in claim 1, wherein the plurality of high-capacity power electronics units are configured to supply precisely one charging point with a direct voltage.

3. The device as claimed in claim 1, wherein the plurality of high-capacity power electronics units have a plurality of silicon carbide semiconductor switches.

4. The device as claimed in claim 1, wherein the AC/DC converter and the DC/DC converter are embodied without galvanic isolation.

5. The device as claimed in claim 3, wherein an efficiency level of the plurality of high-capacity power electronics units is at least temporally at least 97%.

6. The device as claimed in claim 1, wherein the electronics module is arranged in an electronics module housing whose height (H) is one of less than 1.5 m or less than 1.35 m.

7. The device as claimed in claim 1, wherein the electronics module has a multiplicity of power electronics sub-unit receptacles which are each assigned to a respective one of the plurality of high-capacity power electronics units and are configured to receive a power electronics sub-unit, wherein the respective one of the plurality of high-capacity power electronics units is used if a power electronics sub-unit is arranged in at least one of the multiplicity of power electronics sub-unit receptacles.

8. The device as claimed in claim 7, wherein the electronics module has an electronics module housing including an electronics module housing access on one side via which the power electronics sub-unit receptacles for the power electronics sub-units can be accessed in order to permit maintenance.

9. The device as claimed in claim 1, wherein the plurality of high-capacity power electronics units are configured to permit a charging point to be supplied with the maximum charging capacity which is above at least 300 kW.

10. The device as claimed in claim 1, wherein the transformer module is spatially separate from the electronics module.

11. The device as claimed in claim 1, wherein the transformer is configured to permit a simultaneity factor in an entire system which is one of higher than 0.85, higher than 0.9, or is 1.0.

12. The device as claimed in claim 1, wherein the transformer module has a transformer module housing, wherein the electronics module has an electronics module housing, and wherein the transformer module housing and the electronics module housing have a same shape and same dimensions.

13. The device as claimed in claim 1, wherein the cooling module and the electronics module are spatially separate from one another.

14. The device as claimed in claim 1, wherein the cooling module is fluidically connected to the plurality of high-capacity power electronics units.

15. The device as claimed in claim 1, wherein the cooling module has at least two cooling units which are each assigned to a separate coolant circuit.

16. The device as claimed in claim 15, in which the at least two cooling units are fluidically connected to different charging pillars and the plurality of high-capacity power electronics units to permit at least some of the plurality of high-capacity power electronics units and charging pillars to be cooled when one of the at least two cooling units fails.

17. The device as claimed in claim 15, wherein each of the at least two cooling units is designed for at maximum three high-capacity power electronics units and charging points.

18. The device as claimed in claim 1, wherein the cooling module is arranged in a cooling module housing whose height (H) is one of less than 1.5 m or less than 1.35 m.

19. The device as claimed in claim 1, wherein the cooling module has a cooling module housing, wherein the electronics module has an electronics module housing, and wherein the cooling module housing and the electronics module housing have a same shape and same dimensions.

20. The device as claimed in claim 1, wherein the cooling module is fluidically connected to at least two high-capacity power electronics units of the plurality of high-capacity power electronics units in parallel to form the coolant circuit and wherein controllable through-flow control means are provided to influence in relation to one another a cooling power for the at least two high-capacity power electronics units which are connected in parallel.

\* \* \* \* \*